United States Patent
Tanioku

(10) Patent No.: US 8,102,023 B2
(45) Date of Patent: Jan. 24, 2012

(54) CAPACITOR INSULATING FILM, CAPACITOR, AND SEMICONDUCTOR DEVICE

(75) Inventor: Masami Tanioku, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 263 days.

(21) Appl. No.: 12/685,333

(22) Filed: Jan. 11, 2010

(65) Prior Publication Data

US 2010/0176431 A1    Jul. 15, 2010

(30) Foreign Application Priority Data

Jan. 13, 2009    (JP) .................................. 2009-004617

(51) Int. Cl.
*H01L 27/06*    (2006.01)
(52) U.S. Cl. ........ 257/532; 257/277; 257/528; 257/529; 257/530; 257/531; 257/E30.062; 361/311

(58) Field of Classification Search .................. 257/277, 257/528–532, E30.062; 361/311
See application file for complete search history.

(56) References Cited

FOREIGN PATENT DOCUMENTS

| JP | 2004-303871 | 10/2004 |
|---|---|---|
| JP | 2006-245612 | 9/2006 |
| JP | 2007-273587 | 10/2007 |

OTHER PUBLICATIONS

Horikawa et al., "(Ba0.75 Sr0.25)TiO3 Films for 256 Mbit DRAM", IEICE Trans. Electron ., vol. E77-C, No. 3 Mar. 1994, pp. 385-391.
Akedo et al., Highly Insulated SrTiO3, Thin Films, vol. 32, No. 3 (Sep. 1997), pp. 61-70 PP.

*Primary Examiner* — Cuong Q Nguyen
*Assistant Examiner* — Tran Tran
(74) *Attorney, Agent, or Firm* — Young & Thompson

(57) ABSTRACT

A capacitor insulating film for use as an insulating film sandwiched between two electrodes is made of a crystal containing a hafnium element in a titanium site in place of a part of titanium elements contained in a crystal of a strontium titanate or barium strontium titanate.

12 Claims, 5 Drawing Sheets

CAPACITOR INSULATING FILM, CAPACITOR, AND SEMICONDUCTOR DEVICE

BACKGROUND OF THE INVENTION

1. Field of the Invention

The present invention relates to a capacitor insulating film, a capacitor, and a semiconductor device.

2. Description of Related Art

Strontium titanate ($SrTiO_3$; hereinafter referred to as "STO") is well known as a capacitor insulating material having a very high permittivity. For example, Japanese Patent Laid-Open No. 2006-245612 describes a method for manufacturing a capacitor element that uses an STO film as a capacitor insulating film.

However, STO has a band gap of only about 3 eV and is an insulator similar to a semiconductor. Thus, applying a voltage to a capacitor element including an STO film may disadvantageously result in a rapid increase in leakage current from the capacitor element.

For capacitor elements used in semiconductor devices such as DRAMs, the density of a leakage current flowing when an electric field of about 1 MV/cm is applied to the capacitor element needs to be at most 1E-8 $A/cm^2$. A reduction in leakage current is important in making the capacitor element available in recent semiconductor devices for which a reduction in power consumption is demanded.

In recent years, with increasing miniaturization and integration of semiconductor devices such as DRAMs, the size of capacitors forming memory cells has been reduced. This has made provision of a sufficient amount of accumulated charges difficult. To provide a sufficient amount of accumulated charges, the capacitor insulating film needs to have a high permittivity. However, the current design rule for semiconductor devices such as DRAMs specifies at most 50 nm. Thus, even with a capacitor insulating film with a high permittivity, the film thickness of the capacitor insulating film needs to be set to at most 10 nm in order to obtain the desired capacitance of the capacitor. To allow such a reduction in film thickness, an electric field of about 1 MV/cm is inevitably applied between capacitor electrodes. This may disadvantageously result in a high leakage current and even a quick dielectric breakdown in the case of an STO Toyota Central R&D Labs., Inc. Review, Vol. 32, No. 3 (1997. 9) pp. 61-70 contains data on the characteristics of STO indicating that STO has a high relative permittivity of about 200 but that even an electric field (the intensity of an electric field applied during the flow of a current of 1E-8 A per unit area of 1 $cm^2$) of less than 0.1 MV/cm results in a leakage current density of 1E-8 $A/cm^2$. The results of the inventor's experiments also showed that STO had a relative permittivity of 160 and a breakdown voltage of at most 0.4 MV/cm (under the measurement condition of a leakage current of 1E-8 $A/cm^2$).

Furthermore, Toyota Central R&D Labs., Inc. Review, Vol. 32, No. 3 (1997. 9) pp. 61-70 also describes that an increase in the composition ratio of titanium (Ti) to strontium (Sr) Ti/Sr (Ti rich) improves the relative permittivity and the breakdown voltage; in this case, the relative permittivity is about 140 and the breakdown voltage is 0.8 MV/cm (under the measurement condition of a leakage current of 1E-8 $A/cm^2$). The present inventors have also experimentally confirmed this and obtained data similar to that in this document. However, the breakdown voltage still fails to reach 1 MV/cm.

On the other hand, as a high-permittivity material different from STO, barium strontium titanate (($Ba_xSr_{1-x}$)$TiO_3$; hereinafter referred to as "BST") is known in which a part of an Sr site of STO is substituted with a barium element (Ba). Substituting a part of the Sr site with Ba results in an increased permittivity. However, the resultant leakage current characteristics are equivalent to those of STO. An example of a document relating to BST is IEICE (The Institute of Electronics, Information and Communication Engineers) Transactions on Electronics, Vol. E77-C, No. 3 (1994) pp. 385-391. The document describes that barium strontium titanate exhibits a relative permittivity of at least 200 but a breakdown voltage of about 0.5 MV/cm (under the measurement condition of a leakage current of 1E-8 $A/cm^2$), which is not much different from that of STO.

SUMMARY

As described above, when used as a capacitor element, a capacitor insulating film having a high permittivity may disadvantageously offer an increased leakage current. The present invention seeks to solve the problem, or to improve upon the problem.

In one embodiment, there is provided a capacitor insulating film for use as an insulating film sandwiched between two electrodes, wherein the capacitor insulating film is formed of a crystal containing a hafnium element in a titanium site in place of a part of titanium elements contained in a crystal of a strontium titanate or barium strontium titanate.

In another embodiment, there is provided a capacitor including:

a first electrode;

a second electrode opposite to the first electrode; and an insulating film sandwiched between the first electrode and the second electrode, wherein the insulating film is made of a crystal containing a hafnium element in a titanium site in place of a part of titanium elements contained in a crystal of a strontium titanate or barium strontium titanate.

In another embodiment, there is provided a semiconductor device including a MOS transistor and a capacitor, wherein the capacitor includes:

a first electrode;

a second electrode opposite to the first electrode, and an insulating film sandwiched between the first electrode and the second electrode;

the insulating film is made of a crystal containing a hafnium element in a titanium site in place of a part of titanium elements contained in a crystal of a strontium titanate or barium strontium titanate; and one of a source electrode and a drain electrode of the MOS transistor is electrically connected to the first electrode of the capacitor.

According to an embodiment, a capacitor insulating film can be provided which not only exhibits a sufficient permittivity but also enables a reduction in leakage current. Furthermore, the use of the capacitor insulating film serves to provide a capacitor configured to offer a sufficient capacitance, while enabling a reduction in leakage current, and a semiconductor device including the capacitor element.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

A capacitor insulating film according to an embodiment has a simple perovskite crystal structure containing a hafnium element (Hf) in a titanium site in place of a part of titanium elements contained in a crystal of a strontium titanate (SrTiO$_3$; hereinafter appropriately referred to as "STO").

The only difference between an STO crystal and an SrHfO$_3$ crystal, in which all of the Ti site of an STO crystal is occupied with Hf in place of Ti, is based on the substitution of Ti in the Ti site with Hf. Furthermore, Ti and Hf are homologous elements having close ion radii. Thus, a crystal with a mixture of SrTiO$_3$ (STO) and SrHfO$_3$ can be formed.

The present inventors have found that the SrHfO$_3$ crystal exhibits a relative permittivity of about 28 but a very high breakdown voltage of 2.1 MV/cm (under the measurement condition of a leakage current of 1E-8 A/cm$^2$). Thus, the present inventors produced and earnestly examined a mixture crystal Sr(Ti$_x$Hf$_{1-x}$)O$_3$ containing Ti and Hf. As a result, the present inventors have found a composition region in which the crystal offers a breakdown voltage of at least 1 MV/cm (under the measurement condition of a leakage current of 1E-8 A/cm$^2$). The mixture crystal has a relative permittivity which is lower than that of an STO crystal containing no Hf in the Ti site but which is sufficiently high compared to that (about 20) of an ordinary capacitor insulating material presently applied to semiconductor storage devices such as DRAMs.

An example will be described below in which a capacitor element using a capacitor insulating film according to the present embodiment is applied to a memory cell in a DRAM.

Figure 1:
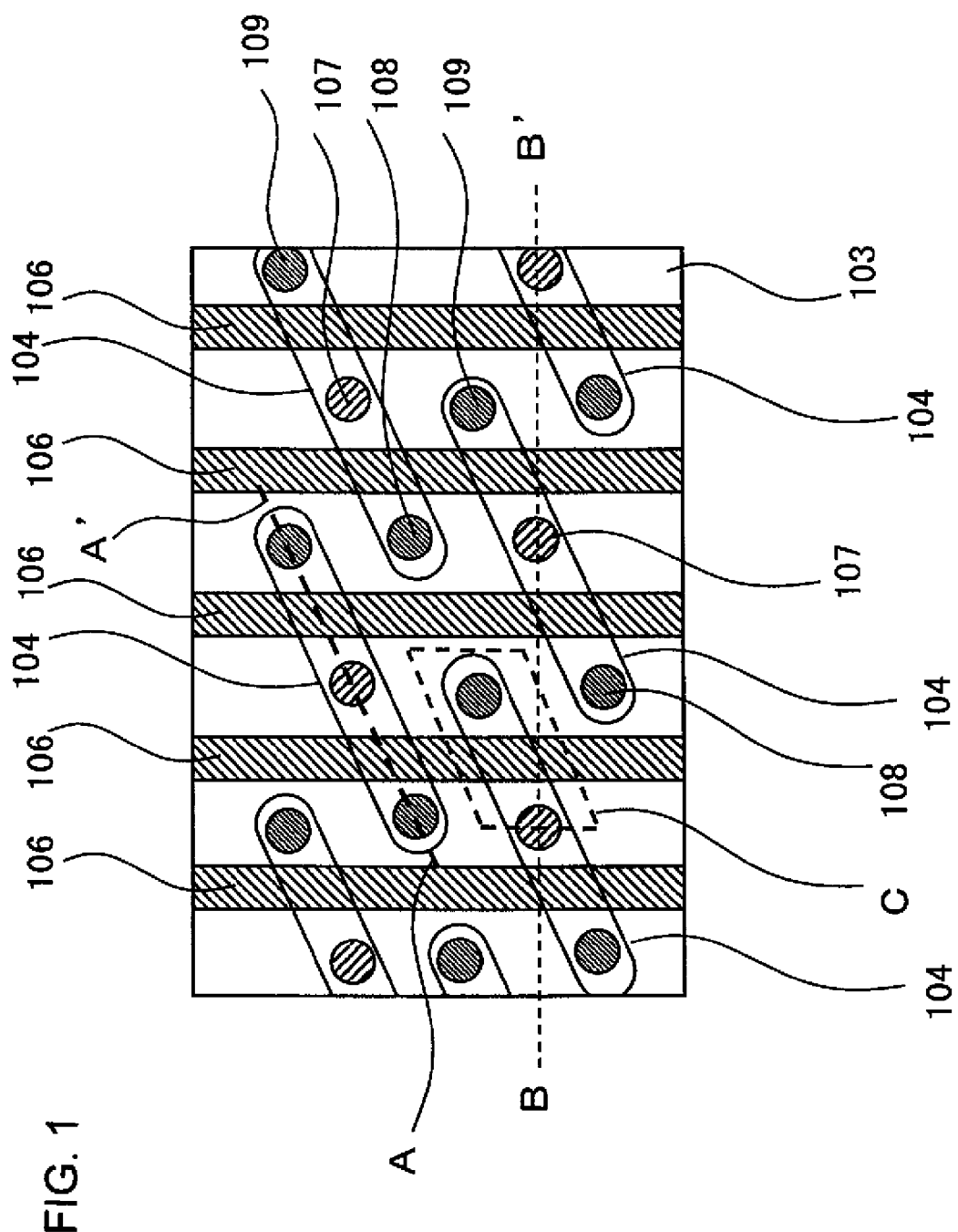
FIG. 1 is a partial plan view of a memory cell region of a DRAM according to an embodiment of the present invention.

FIG. 1 is a plan view of a memory cell region in a DRAM, and schematically shows a part of the memory cell region for description.

In FIG. 1, a plurality of active regions 104 are regularly arranged on a semiconductor substrate (not shown in the drawings). Each of the active regions 104 is partitioned by element isolation regions 103. The element isolation regions 103 can be formed by forming trenches in the semiconductor substrate and burying an insulating film such as a silicon oxide film in the trenches according to a normal method.

A plurality of gate electrodes 106 are arranged so as to cross the active regions 104. The gate electrodes 106 function as word lines for the DRAM. Impurities such as phosphorous are ion-implanted in portions of each active region 104 which are not covered with the gate electrodes 106. N-type diffusion layers are thus formed in these regions. The N-type diffusion layers function as a source region and a drain region of a transistor. In FIG. 1, a portion enclosed by a dashed line forms one MOS transistor.

A contact plug 107 is provided in a central portion of each active region 104 in contact with the N-type diffusion layer in the surface of the active region 104. Contact plugs 108 and 109 are provided at the respective opposite ends of each active region 104 in contact with the N-type diffusion layer in the surface of the active region 104. The contact plugs 107, 108, and 109 carry the different reference numerals for description but can be simultaneously formed during actual manufacturing.

In this layout, to allow memory cells to be densely arranged, two adjacent transistors are provided in one active region so as to share one contact plug 107.

A plurality of wiring layers (not shown in the drawings) are arranged on the transistors; each of the wiring layers is connected to the contact plug 107 and extends orthogonally (along line B-B') to the gate electrodes 106. The wiring layers function as bit lines for the DRAM. Furthermore, capacitor elements (not shown in the drawings) are connected to the respective contact plugs 108 and 109.

Figure 2:
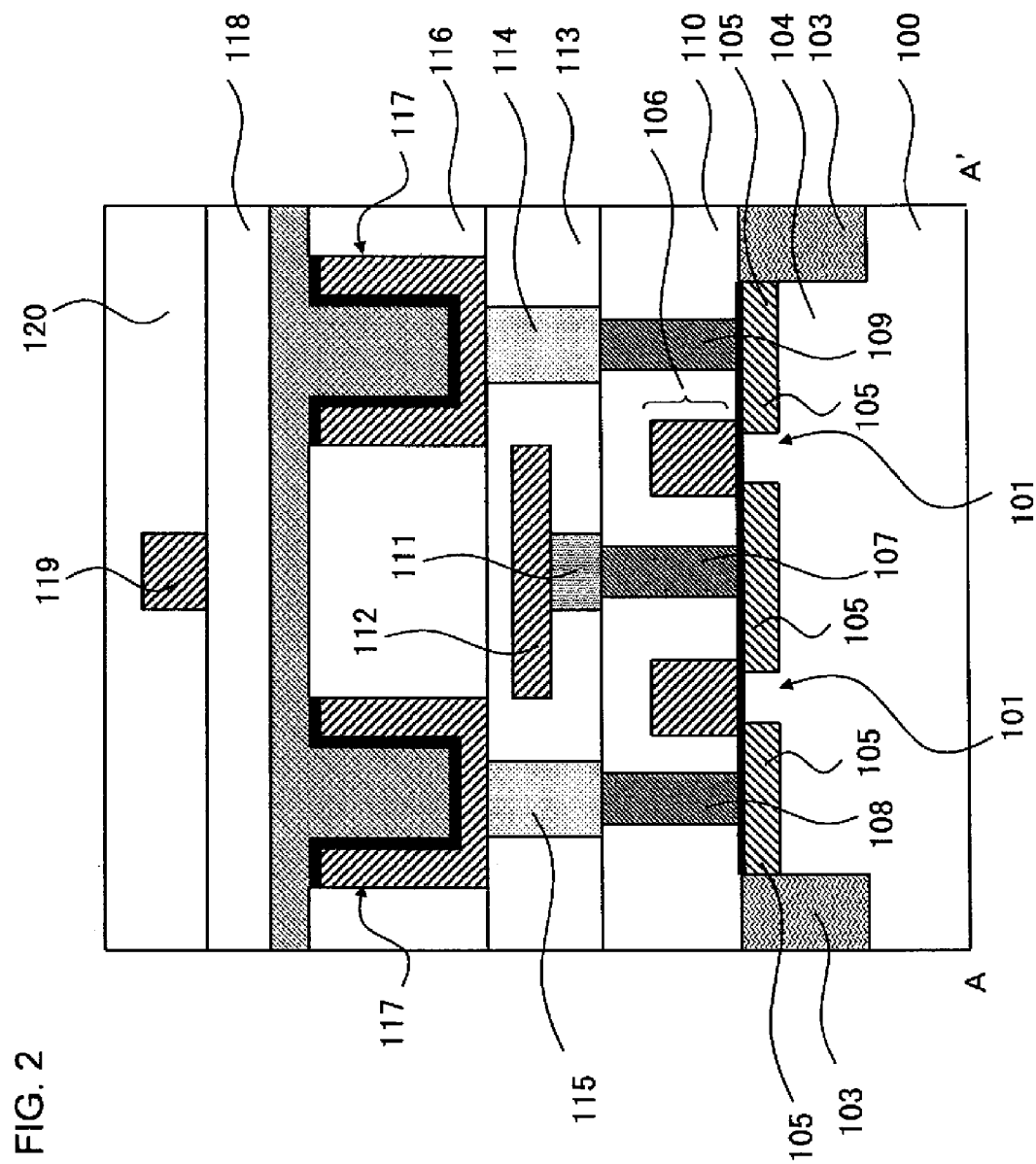
FIG. 2 is a sectional view taken along line A-A' in FIG. 1.

FIG. 2 is a sectional view of a memory cell in the DRAM. FIG. 2 corresponds to a cross section taken along line A-A' in FIG. 1.

The element isolation region 103 is provided on a semiconductor substrate 100 composed of P-type silicon. A MOS transistor 101 is formed in the active region 104 surrounded by the element isolation region 103. The MOS transistor 101 includes the gate electrode 106 configured to function as a word line and N-type diffusion layers 105 formed in a surface portion of the active region 104. The MOS transistor 101 is not limited to a planar type but may be of a trench gate type. The diffusion layers 105 are in contact with the contact plugs 107, 108, and 109 penetrating an interlayer insulating film 110 provided on the MOS transistor. Polycrystalline silicon doped with phosphorous may be used as a material for the contact plugs.

The contact plug 107 is connected, via a separately provided via plug 111, to a wiring layer 112 configured to function as a bit line. Tungsten (W) may be used as a material for the wiring layer 112. On the other hand, the contact plugs 108 and 109 are connected to respective capacitor elements 117 via corresponding via plugs 114 and 115 penetrating an interlayer insulating film 113.

A capacitor element 117 is obtained by forming a lower electrode and a capacitor insulating film in an opening formed in the interlayer insulating film 116 and forming an upper electrode so that the upper electrode is buried in the opening. The capacitor insulating film is a crystal film [composition ratio (atom number ratio): Hf/(Hf+Ti)=0.4] containing Hf in Ti site in place of a part of Ti contained in an STO crystal. Ruthenium (Ru) electrodes are used as an upper electrode and a lower electrode between which the crystal film is sandwiched. A conductive material for the upper and lower electrodes is not particularly limited. In the present embodiment, the capacitor elements are formed to be cylindrical. However, the capacitor elements may be differently shaped.

Wiring layer 119 formed of aluminum, copper, or the like is provided on an interlayer insulating film 118 covering the capacitor elements 117. A surface protection film 120 is provided over the wiring layer.

Turning the MOS transistor 101 on allows determination, via the bit line (wiring layer 112), of whether or not charges are accumulated in the capacitor elements 117. The MOS transistor 101 thus operates as a memory cell in the DRAM.

The capacitor element according to the present embodiment has a relative permittivity of about 100 and a breakdown voltage of about 1.2 MV/cm (under the measurement condition of a leakage current of 1E-8 A/cm$^2$). Thus, the capacitor element with the capacitor insulating film according to the present embodiment not only offers a high permittivity but also enables a reduction in leakage current. Consequently, the present embodiment can provide a memory cell having a large capacity and excellent charge retention characteristics (refresh characteristics). Therefore, the present embodiment can provide a highly integrated DRAM with reduced power consumption and improved performance.

Excellent effects can also be exerted by using, as a capacitor insulating film, a crystal film containing Hf in Ti site in place of a part of Ti contained in a BST crystal instead of the above-described STO.

Figure 3:
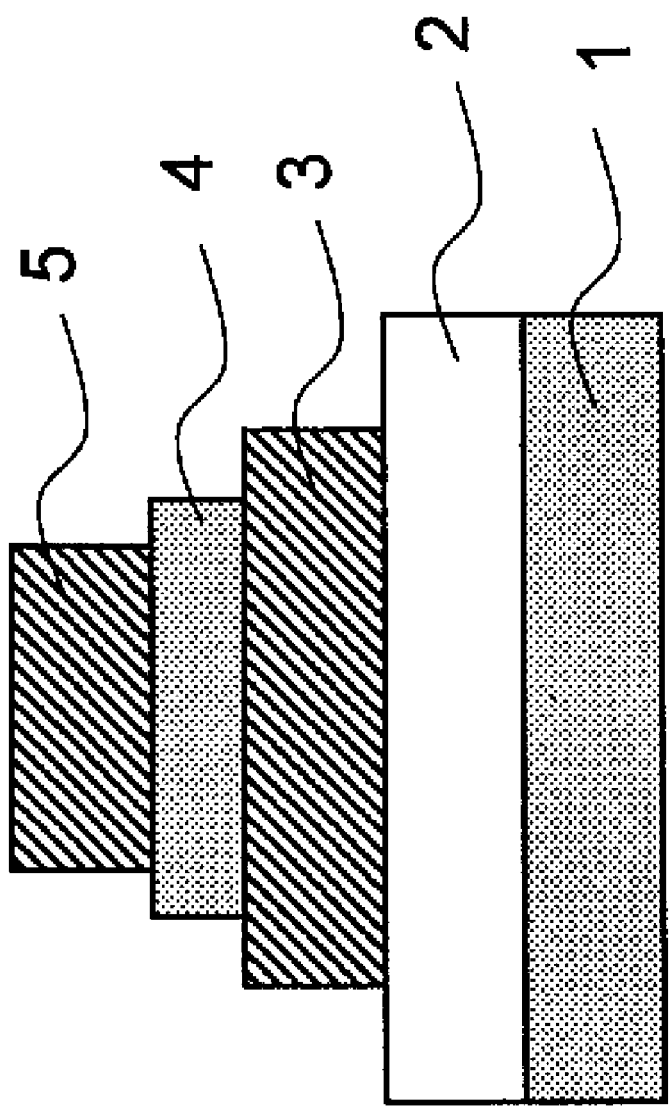
FIG. 3 is a sectional view of a capacitor produced for evaluation.

FIG. 3 is a sectional view of a planar capacitor element produced in order to evaluate the capacitor insulating film. The capacitor element for evaluation was formed as follows.

First, a silicon oxide film ($SiO_2$) 2 of thickness 50 nm was formed on a silicon (Si) substrate 1 by a thermal oxidation method.

Then, a platinum (Pt) film was formed on the silicon oxide film 2 as a lower electrode 3 by a sputtering method. In deposition based on the sputtering method, the temperature of the silicon substrate 1 was set equal to the room temperature, and 25.6 sccm (standard $cm^3$/min) of argon (Ar) gas was allowed to flow. Chamber pressure was maintained at 1.0 Pa and the substrate was discharged at a DC power of 50 W for five minutes. Thus, Pt was deposited to a film thickness of 120 nm.

Then, a deposition apparatus capable of simultaneously sputtering a plurality of targets was used to form a capacitor insulating film 4. $SrTiO_3$ (STD) and $SrHfO_3$ were used as targets, and the two targets were simultaneously discharged. The deposition amount of each target is proportional to the power applied to the target. Thus, controlling power allows the composition ratio of Ti to Hf to be optionally changed. The temperature of the silicon substrate 1 was set to 300° C. With the same amounts of argon (Ar) and oxygen ($O_2$) supplied, the chamber pressure was maintained at 0.5 Pa, and the two targets were supplied with different magnitudes of power. Thus, plural types of insulating films 4 with different composition ratios (atom number ratio) of Hf to Ti were formed so that each of the films had a film thickness of about 40 nm.

Then, a Pt film was formed to a film thickness of 30 nm as an upper electrode 5 as is the case with the lower electrode. Each of the lower electrode 3 and the upper electrode 5 may be formed of a conductive material different from platinum, for example, ruthenium (Ru) or iridium (Ir) or may be stacked films of different materials. Furthermore, the material forming the lower electrode 3 may be different from that forming the upper electrode 5.

Finally, in order to crystallize the capacitor insulating film 4 formed, post-annealing was carried out in an oxygen atmosphere using a furnace type apparatus. Anneal temperature was between 500° C. and 700° C., and crystallization temperature varied depending on the composition ratio of Hf to Ti (atom number ratio). $SrTiO_3$ (STO) was crystallized at about 500° C., and $SrHfO_3$ was crystallized at 650° C. The crystallization temperature was 700° C. when the composition ratio was Hf/Ti=1. For the other composition ratios, the insulating film was crystallized at a crystallization temperature between the above-described three values depending on the composition ratio. The crystallization temperature of $SrTiO_3$ (STO) varies depending on deposition environments such as deposition conditions and a deposition apparatus. Thus, the anneal temperature for the capacitor insulating film is not always between 500° C. and 700° C. and needs to be appropriately set according to the crystallization temperature.

Figure 4:
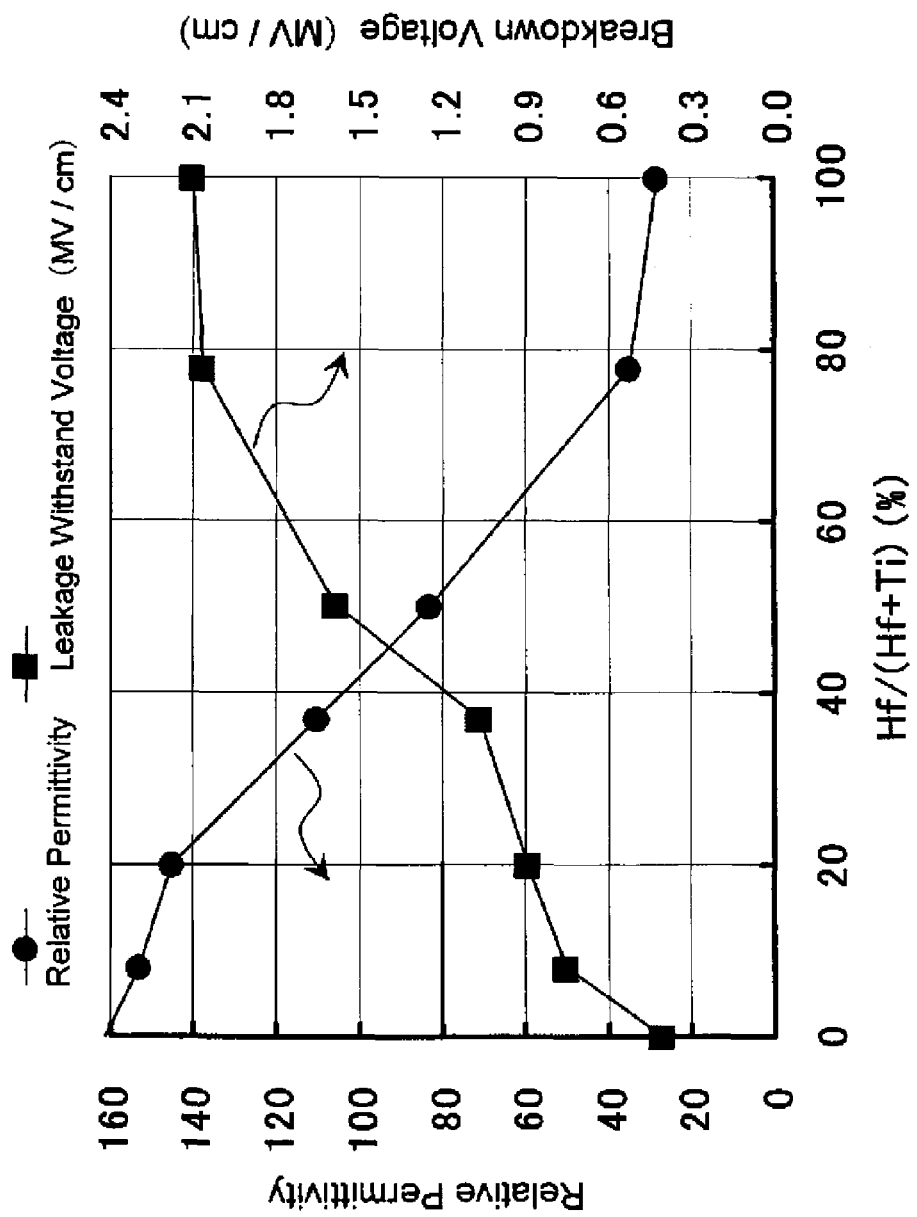
FIG. 4 is a diagram showing the dependence of the relative permittivity and breakdown voltage of a capacitor insulating film on the content ratio of Hf.

FIG. 4 is a plot of the relative permittivity and breakdown voltage of the capacitor element formed as described above, with respect to the ratio of Hf to the sum of Hf and Ti (atom number ratio) [Hf/(Hf+Ti)]. FIG. 4 shows the ratio in terms of percentage. The breakdown voltage is shown in terms of the intensity (MV/cm) of an electric field applied when a current of 10 nA flows per unit area. FIG. 4 shows that at an Hf content ratio (substitution ratio) of at least about 30%, the breakdown voltage is at least 1 MV.

Figure 5:
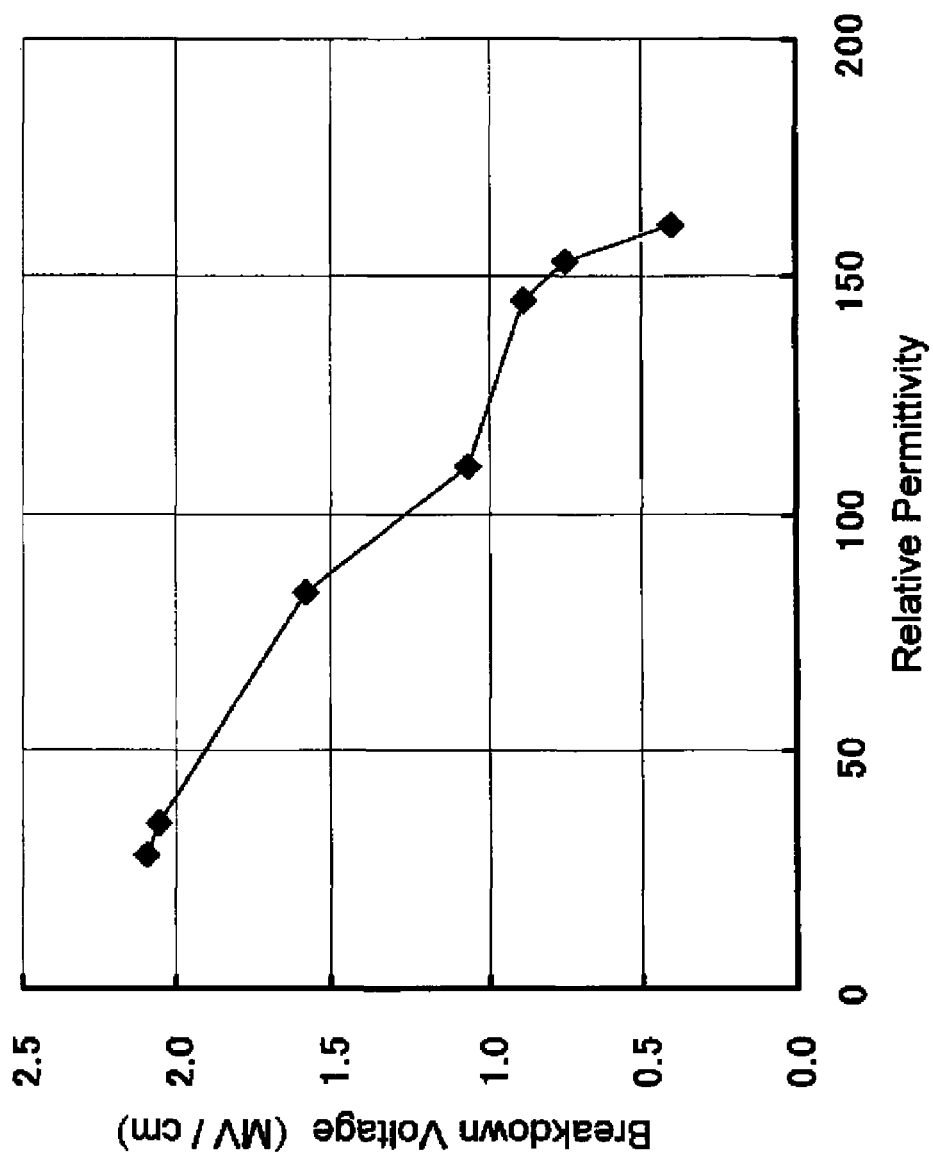
FIG. 5 is a diagram showing the relationship between the relative permittivity and breakdown voltage of the capacitor insulating film.

FIG. 5 is a diagram showing the relationship between the relative permittivity and breakdown voltage based on the results shown in FIG. 4. FIG. 5 indicates the performance of the capacitor element; the performance is higher toward the upper end corner of the figure. The specific characteristics of the capacitor element resulting from a variation in the composition ratio of Hf to Ti are not shown.

As shown in FIG. 4, an increase in the amount of Hf reduces the relative permittivity but raises the breakdown voltage. A reduction in the amount of Hf increases the relative permittivity but lowers the breakdown voltage. Thus, the optimum composition ratio of Hf to Ti may be determined taking into account the capacitance and leakage characteristics of the capacitor required for the semiconductor device to which the capacitor element is applied as well as the relationship between the relative permittivity and breakdown voltage shown in FIG. 5.

In connection only with the breakdown voltage, in order to obtain a breakdown voltage comparable to that of an STO formed simply by changing the conventional composition ratio of Ti to Sr (Toyota Central R&D Labs., Inc. Review, Vol. 32, No. 3 (1997. 9) pp. 61-70), the composition ratio of Ti to Hf according to the present invention [Hf/(Hf+Ti)] is preferably set to at least 0.1. More preferably, setting the composition ratio of Ti to Hf [Hf/(Hf+Ti)] to at least 0.3 provides a breakdown voltage of at least 1 MV/cm. This corresponds to leakage characteristics suitable for the use of the capacitor insulating film in memory cells serving as standard DRAM elements. Even in DRAM elements, the breakdown voltage of the capacitor can be reduced according to the intended use of the elements. Thus, the composition ratio of Ti to Hf may be set so as to obtain the desired breakdown voltage according to the required application.

Furthermore, the upper limit value of the composition ratio of Ti to Hf [Hf/(Hf+Ti)] is preferably at most 0.8 because a composition ratio of larger than 0.8 improves the breakdown voltage only slightly.

The capacitor insulating film according to the present embodiment is made of a crystal film containing Hf in Ti site in place of a part of Ti of an STO crystal. The ratio (atom number ratio) of Sr to the sum of Hf and Ti [Sr/(Hf+Ti)] is 1. In this case, characteristics corresponding to the insulating film according to the present invention cannot be obtained from an amorphous film formed simply by mixing the elements Sr, Hf, and Ti. The composition ratio [Sr/(Hf+Ti)] may deviate slightly (±15%) from a stoichiometry of 1. The deviation may improve the deposition and electrical characteristics of the capacitor insulating film. However, when the composition ratio deviates significantly from 1, the formation of crystal itself in which a part of the Ti site of the STO crystal is substituted with Hf is difficult. Thus, in connection with the crystal formation, the composition ratio [Sr/(Hf+Ti)] is preferably at least 0.85 on the lower limit side and at most 1.15 on the upper limit side.

The above-described method for manufacturing a capacitor insulating film is illustrative. The capacitor insulating film can be formed by a CVD (Chemical Vapor Deposition) method, an ALD (Atomic Layer Deposition) method, or the like instead of the sputtering method.

The capacitor element according to the present embodiment can be used for applications other than memory cells in DRAMs. For example, the capacitor element according to the present embodiment is applicable even to, for example, general semiconductor devices such as a logical type which include no memory cell, provided that the devices use capacitor elements.

A high-permittivity capacitor insulating film enabling a reduction in leakage current can be formed by using a crystal containing Hf in Ti site in place of a part of Ti contained in a crystal of barium strontium titanate ($BaSrTiO_3$; hereinafter appropriately referred to as "BST") instead of the above-described STO crystal. The only difference between the BST crystal and the $BaSrHfO_3$ crystal, in which all of the Ti site of the BST crystal is occupied with Hf in place of Ti, is based on the substitution of Ti in the Ti site with Hf. Furthermore, Ti and Hf are homologous elements having close ion radii. Thus, a crystal composed of a mixture of $BaSrTiO_3$ (BST) and $BaSrHfO_3$ can be formed. In this mixture crystal film, an increase in the amount of Hf reduces the relative permittivity but raises the breakdown voltage. Furthermore, a reduction in the amount of Hf increases the relative permittivity but lowers breakdown voltage. Consequently, the optimum ratio of Hf to Ti may be determined according to the capacitance and leakage characteristics of the capacitor required for the semiconductor device to which the capacitor element is applied.

As is the case with the above-described STO crystal, in connection with the breakdown voltage, the lower limit value for the composition ratio of Ti to Hf [Hf/(Hf+Ti)] is preferably at least 0.1 and more preferably at least 0.3. Furthermore, as is the case with the above-described STO crystal, the upper limit value for the composition ratio of Ti to Hf [Hf/(Hf+Ti)] is preferably at most 0.8.

in connection with crystal formation, the ratio (atom number ratio) of the sum of Sr and Ba to the sum of Hf and Ti [(Sr+Ba)/(Hf+Ti)] is preferably at least 0.85 on the lower limit side and at most 1.15 on the upper limit side.

According to the above-described embodiment, a capacitor insulating film can be provided which not only exhibits a sufficient permittivity but also enables a reduction in leakage current. Furthermore, the use of the capacitor insulating film serves to provide a fine capacitor configured to offer a sufficient capacitance, while enabling a reduction in leakage current. Furthermore, a highly integrated semiconductor device with reduced power consumption can be provided.

It is apparent that the present invention is not limited to the above embodiments, but may be modified and changed without departing from the scope and spirit of the invention.

What is claimed is:

1. A capacitor insulating film for use as an insulating film sandwiched between two electrodes, wherein the capacitor insulating film is made of a crystal containing a hafnium element in a titanium site in place of a part of titanium elements contained in a crystal of a strontium titanate or barium strontium titanate.

2. The capacitor insulating film according to claim 1, wherein a ratio of the hafnium element to a sum of the titanium element and the hafnium element [Hf/(Hf+Ti)] is at least 0.1.

3. The capacitor insulating film according to claim 1, wherein a ratio of the hafnium element to a sum of the titanium element and the hafnium element [Hf/(Hf+Ti)] is at least 0.3.

4. The capacitor insulating film according to claim 1, wherein a ratio of the hafnium element to a sum of the titanium element and the hafnium element [Hf/(Hf+Ti)] is at least 0.3 and at most 0.8.

5. A capacitor comprising:
a first electrode;
a second electrode opposite to the first electrode; and
an insulating film sandwiched between the first electrode and the second electrode,
wherein the insulating film is made of a crystal containing a hafnium element in a titanium site in place of a part of titanium elements contained in a crystal of a strontium titanate or barium strontium titanate.

6. The capacitor according to claim 5, wherein a ratio of the hafnium element to a sum of the titanium element and the hafnium element [Hf/(Hf+Ti)] is at least 0.1 in the crystal forming the insulating film.

7. The capacitor according to claim 5, wherein a ratio of the hafnium element to a sum of the titanium element and the hafnium element [Hf/(Hf+Ti)] is at least 0.3 in the crystal forming the insulating film.

8. The capacitor according to claim 5, wherein a ratio of the hafnium element to a sum of the titanium element and the hafnium element [Hf/(Hf+Ti)] is at least 0.3 and at most 0.8 in the crystal forming the insulating film.

9. The capacitor according to claim 8, wherein the insulating film is made of a crystal containing a hafnium element in a titanium site in place of a part of titanium elements contained in a crystal of a strontium titanate, and a ratio of the strontium element to a sum of the titanium element and the hafnium element [Sr/(Hf+Ti)] is at least 0.85 and at most 1.15 in the crystal forming the insulating film.

10. The capacitor according to claim 8, wherein the insulating film is made of a crystal containing a hafnium element in a titanium site in place of a part of titanium elements contained in a crystal of a barium strontium titanate, and a ratio of a sum of the strontium element and the barium element to a sum of the titanium element and the hafnium element [(Sr+Ba)/(Ti+Hf)] is at least 0.85 and at most 1.15 in the crystal forming the insulating film.

11. A semiconductor device comprising a MOS transistor and a capacitor,
wherein the capacitor comprises:
a first electrode,
a second electrode opposite to the first electrode, and
an insulating film sandwiched between the first electrode and the second electrode;
the insulating film is made of a crystal containing a hafnium element in a titanium site in place of a part of titanium elements contained in a crystal of a strontium titanate or barium strontium titanate; and
one of a source electrode and a drain electrode of the MOS transistor is electrically connected to the first electrode of the capacitor.

12. The semiconductor device according to claim 11, wherein a ratio of the hafnium element to a sum of the titanium element and the hafnium element [Hf/(Hf+Ti)] is at least 0.3 and at most 0.8 in the crystal forming the insulating film.

* * * * *